(12) United States Patent
Shlomot et al.

(10) Patent No.: US 9,973,174 B2
(45) Date of Patent: May 15, 2018

(54) METHOD AND APPARATUS FOR DETERMINING STABILITY FACTOR OF ADAPTIVE FILTER

(71) Applicant: Huawei Technologies Co., Ltd., Shenzhen (CN)

(72) Inventors: Eyal Shlomot, Long Beach, CA (US); Yuanyuan Liu, Shenzhen (CN); Haiting Li, Beijing (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days. days.

(21) Appl. No.: 15/400,147

(22) Filed: Jan. 6, 2017

(65) Prior Publication Data
US 2017/0117878 A1 Apr. 27, 2017

Related U.S. Application Data

(63) Continuation of application No. PCT/CN2015/070219, filed on Jan. 6, 2015.

(30) Foreign Application Priority Data

Aug. 22, 2014 (CN) .......................... 2014 1 0418591

(51) Int. Cl.
  *G06F 17/10* (2006.01)
  *H03H 21/00* (2006.01)
  *G06F 17/16* (2006.01)
(52) U.S. Cl.
  CPC ......... *H03H 21/0043* (2013.01); *G06F 17/16* (2013.01)
(58) Field of Classification Search
  CPC .............................. H03H 21/0043; G06F 17/16
  (Continued)

(56) References Cited

U.S. PATENT DOCUMENTS

| | | | |
|---|---|---|---|
| 6,744,886 B1 * | 6/2004 | Benesty | H04B 3/234 370/465 |
| 6,754,340 B1 * | 6/2004 | Ding | H03H 21/0012 370/465 |
| 6,895,094 B1 * | 5/2005 | Scalart | H04B 3/23 379/406.01 |

FOREIGN PATENT DOCUMENTS

| | | |
|---|---|---|
| CN | 1607740 A | 4/2005 |
| CN | 101572092 A | 11/2009 |

(Continued)

OTHER PUBLICATIONS

Machine Translation and Abstract of Chinese Publication No. CN101572092, Nov. 4, 2009, 17 pages.

(Continued)

*Primary Examiner* — Tan V. Mai
(74) *Attorney, Agent, or Firm* — Conley Rose, P.C.

(57) ABSTRACT

A method and an apparatus for determining a stability factor of an adaptive filter is presented. The method includes: determining, according to first input signal that are input to an adaptive filter, a reference input matrix of the first input signal; determining a stability parameter of the first input signal according to the reference input matrix; and determining a stability factor of the adaptive filter according to the stability parameter. According to the method and apparatus for determining a stability factor of an adaptive filter provided in the embodiments of the present application, the stability factor of the adaptive filter can be adaptively obtained according to a stability feature of the first input signal, and the adaptive filter can reach a balance between a convergence speed and steady state error performance.

10 Claims, 5 Drawing Sheets

(58) Field of Classification Search
USPC .................................................. 708/322–323
See application file for complete search history.

(56) References Cited

FOREIGN PATENT DOCUMENTS

| CN | 102736069 A | 10/2012 |
|---|---|---|
| CN | 103716013 A | 4/2014 |
| CN | 104202018 A | 12/2014 |
| GB | 2406487 A | 3/2005 |

OTHER PUBLICATIONS

Machine Translation and Abstract of Chinese Publication No. CN102736069, Oct. 17, 2012, 9 pages.
Machine Translation and Abstract of Chinese Publication No. CN103716013, Apr. 9, 2014, 10 pages.
Foreign Communication From a Counterpart Application, PCT Application No. PCT/CN2015/070219, English Translation of International Search Report dated Jun. 1, 2015, 2 pages.
Foreign Communication From a Counterpart Application, PCT Application No. PCT/CN2015/070219, English Translation of Written Opinion dated Jun. 1, 2015, 9 pages.
Ban, S., J., et al., "Adaptive Regularization Parameter for Pseudo Affine Projection Algorithm," XP11253958, IEEE Signal Processing Letters, vol. 16, No. 5, May 2009, pp. 382-385.
Yin, W., et al., "A Variable Regularization Method for Affine Projection Algorithm," XP11334207, IEEE Transactions on Circuits and Systems—II: Express Briefs, vol. 57, No. 6, Jun. 2010, pp. 476-480.
Challa, D., et al., "Variable Regularized Fast Affine Projections," XP31462805, IEEE International Conference on Acoustics, Speech, and Signal Processing, Apr. 15, 2007, pp. 89-92.
Ba, A., et al., "Time-Variant Regularization in Affine Projection Algorithms," XP32565301, Fifty-first Annual Allerton Conference, Oct. 2-3, 2013, pp. 1466-1473.
Foreign Communication From a Counterpart Application, European Application No. 15833705.5, Extended European Search Report dated Jul. 17, 2012, 12 pages.

\* cited by examiner

METHOD AND APPARATUS FOR DETERMINING STABILITY FACTOR OF ADAPTIVE FILTER

CROSS-REFERENCE TO RELATED APPLICATIONS

This application is a continuation of International Application No. PCT/CN2015/070219, filed on Jan. 6, 2015, which claims priority to Chinese Patent Application No. 201410418591.4, filed on Aug. 22, 2014, both of which are hereby incorporated by reference in their entireties.

TECHNICAL FIELD

Embodiments of the present application relate to the communications field, and more specifically, to a method and an apparatus for determining a stability factor of an adaptive filter.

BACKGROUND

With the development of an adaptive filtering technology, many different adaptive filtering algorithms that can be applied to echo cancellation and noise cancellation emerge. The most common algorithm is a least mean square (LMS) algorithm, and implementation of the algorithm is relatively simple, but a convergence speed of an adaptive filter is relatively slow. To improve the convergence speed of the adaptive filter, a normalized least mean square (NLMS) algorithm is put forward, and an update step of the adaptive filter in this algorithm changes according to features of input signals. To further improve the convergence speed of the adaptive filter, an affine projection algorithm (APA) is further put forward, and a smaller projection order indicates lower calculation complexity, but a larger projection order indicates a faster convergence speed of the adaptive filter. The calculation complexity of the algorithm is higher than that of the LMS algorithm, but is lower than that of a least square (LS) algorithm.

Regardless of the NLMS algorithm or the APA algorithm, to enable a division operation or an inversion operation in a formula for determining a coefficient of the adaptive filter to have a solution, a stability factor of the adaptive filter is generally introduced. A value of the stability factor of the adaptive filter generally greatly affects the convergence speed of the adaptive filter and a steady state error after convergence. If the value of the stability factor of the adaptive filter is relatively large, the convergence speed of the adaptive filter is reduced, but the steady state error after convergence is smaller. If the value of the stability factor of the adaptive filter is relatively small, the convergence speed of the adaptive filter is faster, but the filter may diverge, or a problem that the steady state error becomes larger because the filter rejects to converge may occur.

However, in general, a constant is selected experientially as the value of the stability factor of the adaptive filter. As a result, the adaptive filter cannot reach a good balance between the convergence speed and steady state error performance.

SUMMARY

Embodiments of the present application provide a method and an apparatus for determining a stability factor of an adaptive filter, so that a stability factor of an adaptive filter is adaptively obtained according to a stability feature of first input signal, and the adaptive filter can reach a balance between a convergence speed and steady state error performance.

According to a first aspect, a method for determining a stability factor of an adaptive filter is provided, where the method includes determining, according to first input signal that is input to an adaptive filter, a reference input matrix of the first input signal; determining a stability parameter of the first input signal according to the reference input matrix; and determining a stability factor of the adaptive filter according to the stability parameter.

With reference to the first aspect, in a first possible implementation manner of the first aspect, the stability factor is determined according to the stability parameter and a decreasing function relation between the stability factor and the stability parameter.

With reference to the first possible implementation manner of the first aspect, in a second possible implementation manner of the first aspect, when the stability parameter is greater than or equal to a first threshold and is less than or equal to a second threshold, the stability factor is determined according to the following function relational expression:

$$k_\delta = A\alpha + B,$$

where $k_\delta$ is the stability factor, $\alpha$ is the stability parameter, A is a real number less than 0, and B is a real number greater than 0.

With reference to the first aspect, in a third possible implementation manner of the first aspect, when the stability parameter is less than or equal to a third threshold, it is determined that the stability factor is a first constant, or when the stability parameter is greater than or equal to a fourth threshold, it is determined that the stability factor is a second constant, where the third threshold is less than the fourth threshold, both the first constant and the second constant are numbers greater than 0, and the first constant is greater than the second constant.

With reference to the first aspect or any one of the possible implementation manners, in a fourth possible implementation manner of the first aspect, the reference input matrix is transposed, to obtain a transposed matrix, the transposed matrix is multiplied by the reference input matrix, to obtain a first matrix; and a value of a determinant of the first matrix is determined as the stability parameter.

With reference to the first aspect or any one of the first to the third possible implementation manners of the first aspect, in a fifth possible implementation manner of the first aspect, the reference input matrix is transposed, to obtain a transposed matrix, the transposed matrix is multiplied by the reference input matrix, to obtain a second matrix; and a result obtained by taking a logarithm of a value of a determinant of the second matrix is determined as the stability parameter.

With reference to the first aspect or any one of the possible implementation manners, in a sixth possible implementation manner of the first aspect, the method further includes determining, according to second input signal that is input to the adaptive filter, an input vector of the second input signal; determining an output signal at a current time according to a coefficient of the adaptive filter at the current time, the input vector, and the reference input matrix; and determining a filtering coefficient of the adaptive filter according to the reference input matrix, the output signal, the stability factor, and an update step of the adaptive filter.

According to a second aspect, an apparatus for determining a stability factor of an adaptive filter is provided, where the apparatus includes a first determining module configured to determine, according to first input signal that is input to an adaptive filter, a reference input matrix of the first input signal; a second determining module configured to determine a stability parameter of the first input signal according to the reference input matrix determined by the first determining module; and a third determining module configured to determine a stability factor of the adaptive filter according to the stability parameter determined by the second determining module.

With reference to the second aspect, in a first possible implementation manner of the second aspect, the third determining module is configured to determine the stability factor according to the stability parameter and a decreasing function relation between the stability factor and the stability parameter.

With reference to the first possible implementation manner of the second aspect, in a second possible implementation manner of the second aspect, the third determining module includes a first determining unit configured to, when the stability parameter determined by the second determining module is greater than or equal to a first threshold and is less than or equal to a second threshold, determine the stability factor according to the following function relational expression:

$$k_\delta = A\alpha + B,$$

where $k_\delta$ is the stability factor, $\alpha$ is the stability parameter, A is a real number less than 0, and B is a real number greater than 0.

With reference to the second aspect, in a third possible implementation manner of the second aspect, the third determining module includes a second determining unit configured to, when the stability parameter determined by the second determining module is less than or equal to the third threshold, determine that the stability factor is a first constant; and a third determining unit configured to, when the stability parameter determined by the second determining module is greater than or equal to a fourth threshold, determine that the stability factor is a second constant, where the third threshold is less than the fourth threshold, both the first constant and the second constant are numbers greater than 0, and the first constant is greater than the second constant.

With reference to the second aspect or any one of the possible implementation manners, in a fourth possible implementation manner of the second aspect, the second determining module includes a first determining unit configured to transpose the reference input matrix, to obtain a transposed matrix; a multiplication unit configured to multiply the transposed matrix obtained by the first determining unit by the reference input matrix, to obtain a first matrix; and a second determining unit configured to determine a value of a determinant of the first matrix obtained by the multiplication unit as the stability parameter.

With reference to the second aspect or any one of the first to the third possible implementation manners of the second aspect, in a fifth possible implementation manner of the second aspect, the second determining module includes a first determining unit configured to transpose the reference input matrix, to obtain a transposed matrix; a multiplication unit configured to multiply the transposed matrix obtained by the first determining unit by the reference input matrix, to obtain a second matrix; and a third determining unit configured to determine, as the stability parameter, a result obtain by taking a logarithm of a value of a determinant of the second matrix obtained by the multiplication unit.

With reference to the second aspect or any one of the possible implementation manners, in a sixth possible implementation manner of the second aspect, the apparatus further includes a fourth determining module configured to determine, according to second input signal of the filter, an input vector of the second input signal; a fifth determining module configured to determine an output signal at a current time according to a coefficient of the adaptive filter at the current time, the input vector determined by the fourth determining module, and the reference input matrix determined by the first determining module; and a sixth determining module configured to determine a filtering coefficient of the adaptive filter according to the reference input matrix determined by the first determining module, the output signal determined by the fifth determining module, the stability factor determined by the third determining module, and an update step of the adaptive filter.

Therefore, according to the method for determining a stability factor of an adaptive filter provided in the embodiments of the present application, a stability factor of an adaptive filter is determined according to a stability parameter of first input signal that is determined according to a reference input matrix of the first input signal of the adaptive filter, so that the stability factor of the adaptive filter can be adaptively obtained according to a stability feature of the first input signal, and the adaptive filter can reach a balance between a convergence speed and steady state error performance.

BRIEF DESCRIPTION OF DRAWINGS

To describe the technical solutions in the embodiments of the present application more clearly, the following briefly describes the accompanying drawings required for describing the embodiments of the present application. The accompanying drawings in the following description show merely some embodiments of the present application, and a person of ordinary skill in the art may still derive other drawings from these accompanying drawings without creative efforts.

DESCRIPTION OF EMBODIMENTS

The following clearly describes the technical solutions in the embodiments of the present application with reference to the accompanying drawings in the embodiments of the present application. The described embodiments are a part rather than all of the embodiments of the present application. All other embodiments obtained by a person of ordinary skill in the art based on the embodiments of the present application without creative efforts shall fall within the protection scope of the present application.

Figure 1:
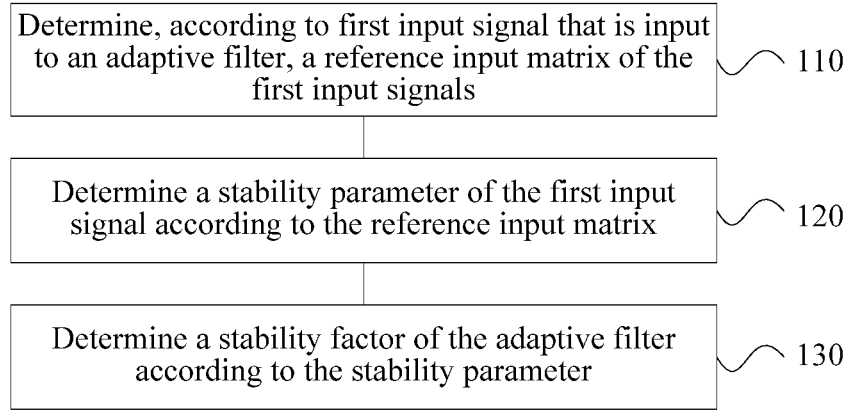
FIG. 1 is a schematic flowchart of a method for determining a stability factor of an adaptive filter according to an embodiment of the present application.

FIG. 1 is a schematic flowchart of a method 100 for determining a stability factor of an adaptive filter according to an embodiment of the present application. FIG. 1 may be executed by an apparatus for determining a stability factor of an adaptive filter, and the method 100 shown in FIG. 1 includes the following steps:

Step 110: Determine, according to first input signal that is input to an adaptive filter, a reference input matrix of the first input signal.

Step 120: Determine a stability parameter of the first input signal according to the reference input matrix.

Step 130: Determine a stability factor of the adaptive filter according to the stability parameter.

In this embodiment of the present application, the apparatus for determining a stability factor of an adaptive filter may obtain a first input signal that is input to an adaptive filter at a current time and first input signal that are input to the adaptive filter at multiple historical times, to construct a reference input matrix, and determine a stability parameter of the first input signal according to the reference input matrix, the apparatus may determine a stability factor of the adaptive filter according to the stability parameter.

Therefore, according to the method for determining a stability factor of an adaptive filter provided in this embodiment of the present application, a stability factor of an adaptive filter is determined according to a stability parameter of first input signal that is determined according to a reference input matrix of the first input signal of the adaptive filter, so that the stability factor of the adaptive filter can be adaptively obtained according to a stability feature of the first input signal, and the adaptive filter can reach a balance between a convergence speed and steady state error performance.

In this embodiment of the present application, in step 110, the adaptive filter may obtain the first input signal that is input to the adaptive filter at the current time and the first input signal that are input to the adaptive filter at the multiple historical times, and may construct the reference input matrix using the first input signal according to an adaptive filtering algorithm used by the adaptive filter, where the first input signal may be input to the adaptive filter in a form of a signal vector.

It should be understood that, in this embodiment of the present application, because the adaptive filter may use different algorithms, the reference input matrix constructed according to the first input signal includes an L×1 dimensional vector or an L×p dimensional matrix. That is, the reference input matrix may be a vector, or may be a matrix, which is not limited in the present application.

For example, the adaptive filter may use a NLMS algorithm, and may construct a reference input matrix x(n) according to the first input signal:

$$x(n)=[x(n),x(n-1),\ldots,x(n-L+1)]^T,$$

where x(n) is a first input signal at an $n^{th}$ time, and L is a length of the adaptive filter. That is, the reference input matrix may be constructed according to the first input signal at the $n^{th}$ time and L−1 first input signal at L−1 times before the $n^{th}$ time, and the reference input matrix is an L×1 reference input vector. In other words, in the NLMS algorithm, a reference input vector x(n) may be constructed according to the first input signal at the $n^{th}$ time and the L−1 first input signal at the L−1 times before the $n^{th}$ time, a stability parameter of the first input signal is determined according to the reference input vector x(n), and then a stability factor of the adaptive filter at the $n^{th}$ time is determined according to the determined stability parameter.

For another example, the adaptive filter may use an APA algorithm, and may construct a reference input matrix X(n) according to the first input signal:

$$X(n) = \begin{bmatrix} x(n) & \cdots & x(n-p+1) \\ \vdots & \ddots & \vdots \\ x(n-L+1) & \cdots & x(n-p-L+2) \end{bmatrix},$$

where x(n) is a first input signal at an $n^{th}$ time, L is a length of the adaptive filter, and p is an order of the adaptive filter and is a quantity of columns of the reference input matrix X(n).

Optionally, in an embodiment, in step 120, the reference input matrix may be transposed, to obtain a transposed matrix; the transposed matrix is multiplied by the reference input matrix, to obtain a first matrix; and a value of a determinant of the first matrix is determined as the stability parameter.

In this embodiment of the present application, a product of the reference input matrix constructed according to the first input signal and the transposed matrix of the reference input matrix may be determined as the first matrix, then the value of the determinant of the first matrix is determined as a stability parameter α of the first input signal, and the stability factor of the adaptive filter is determined according to the determined stability parameter α.

Alternatively, the reference input matrix may be transposed, to obtain a transposed matrix; a sum of a positive real number and a result of multiplying the transposed matrix by the reference input matrix is determined as a first matrix; and a value of a determinant of the first matrix is determined as the stability parameter of the first input signal, so that the value of the determinant may be a positive number that is not zero.

For example, when the adaptive filter uses the NLMS algorithm, the stability parameter α of the first input signal may be determined according to the following equation, that is, the stability parameter α is a parameter for representing an autocorrelation characteristic of the reference input vector x(n) constructed according to the first input signal:

$$\alpha=|x(n)^T\cdot x(n)|;\text{ or}$$

the stability parameter α of the first input signal may be determined according to the following equation:

$$\alpha=|x(n)^T\cdot x(n)+\delta|,$$

where x(n) is a reference input vector at the $n^{th}$ time, $x(n)^T$ is a transposed vector of the reference input vector x(n), δ is a real number, and a value of δ may range from 1 to $10^5$. For example, the value of δ may be $10^5$.

For another example, when the adaptive filter uses the APA algorithm, the stability parameter α of the first input signal may be determined according to the following equation, that is, the stability parameter α is a parameter for representing an autocorrelation characteristic of the reference input matrix X(n) constructed according to the first input signal:

$$\alpha=|X(n)^T\cdot X(n)|;\text{ or}$$

the stability parameter α of the first input signal may be determined according to the following equation:

$$\alpha=|X(n)^T\cdot X(n)+\delta|,$$

where X(n) is a reference input matrix at the $n^{th}$ time, $X(n)^T$ is a transposed matrix of the reference input matrix X(n), δ is a real number, and a value of δ may range from 1 to $10^5$. For example, the value of δ may be $10^5$.

Optionally, in another embodiment, in step 120, the reference input matrix may be transposed, to obtain a transposed matrix; the transposed matrix is multiplied by the reference input matrix, to obtain a second matrix; and a result obtained by taking a logarithm of a value of a determinant of the second matrix is determined as the stability parameter.

In this embodiment of the present application, a product of the reference input matrix constructed according to the first input signal and the transposed matrix of the reference input matrix may be determined as the second matrix, then the result obtained by taking the logarithm of the value of the determinant of the second matrix is determined as a stability parameter α of the first input signal, and the stability factor of the adaptive filter is determined according to the determined stability parameter α.

Therefore, according to the method in this embodiment of the present application, the stability parameter α of the first input signal is determined in a logarithm domain, which can effectively reduce a value range of the stability parameter α, making it easier to determine a value of the stability factor of the adaptive filter.

Alternatively, the reference input matrix may be transposed, to obtain a transposed matrix; a sum of a positive real number and a result of multiplying the transposed matrix by the reference input matrix is determined as a second matrix; and a result obtained by taking a logarithm of a value of a determinant of the second matrix is determined as the stability parameter of the first input signal, so that the value of the determinant may be a positive number that is not zero.

For example, when the adaptive filter uses the NLMS algorithm, the stability parameter α of the first input signal may be determined according to the following equation, that is, the stability parameter α is a parameter for representing an autocorrelation characteristic of the reference input vector x(n) constructed according to the first input signal:

$$\alpha=\log|x(n)^T\cdot x(n)|; \text{ or}$$

the stability parameter α of the first input signal may be determined according to the following equation:

$$\alpha=\log|x(n)^T\cdot x(n)+\delta|,$$

where x(n) is a reference input vector at an $n^{th}$ time, $x(n)^T$ is a transposed vector of the reference input vector x(n), δ is a real number, and a value of δ may range from 1 to $10^5$. For example, the value of δ may be $10^5$.

It should be understood that, in this embodiment of the present application, a base of the logarithm may be 10, that is, $\alpha=\lg|x(n)^T x(n)|$, or may be e, that is, $\alpha=\ln|x(n)^T\cdot x(n)|$, or may be another constant, which is not limited in this embodiment of the present application.

For another example, when the adaptive filter uses the APA algorithm, the stability parameter α of the first input signal may be determined according to the following equation, that is, the stability parameter α is a parameter for representing an autocorrelation characteristic of the reference input matrix X(n) constructed according to the first input signal:

$$\alpha=\log|X(n)^T\cdot X(n)|; \text{ or}$$

the stability parameter α of the first input signal may be determined according to the following equation:

$$\alpha=\log|X(n)^T\cdot X(n)+\delta|,$$

where X(n) is a reference input matrix at the $n^{th}$ time, $X(n)^T$ is a transposed matrix of the reference input matrix X(n), δ is a real number, and a value of δ may range from 1 to $10^5$. For example, the value of δ may be $10^5$.

It should be understood that, in this embodiment of the present application, a base of the logarithm may be 10, that is, $\alpha=\lg|X(n)^T|X(n)|$, or may be e, that is, $\alpha=\ln|X(n)^T\cdot X(n)|$, or may be another constant, which is not limited in this embodiment of the present application.

Optionally, in another embodiment, in 130, the stability factor may be determined according to a decreasing function relation between the stability factor and the stability parameter. In other words, a value of the stability factor decreases when a value of the stability parameter increases.

Alternatively, the stability factor of the adaptive filter may be determined according to an inverse relationship between the stability factor and the stability parameter. That is, when a value of the stability parameter is large, a value of the stability factor is small. When a value of the stability parameter is small, a value of the stability factor is large. When the value of the stability parameter is large, the first input signal has a high correlation and relatively good stability, and a relatively small stability factor may be selected to improve a convergence speed. When the value of the stability parameter is small, the first input signal have relatively low correlation and relatively poor stability, and a relatively large stability factor may be selected, to avoid a problem that the adaptive filter diverges because an update rate of a coefficient of the adaptive filter is excessively fast.

It should be understood that, in this embodiment of the present application, it may be determined that the stability factor is a linear decreasing function of the stability parameter, or may be determined that the stability factor is a function of an inverse relationship of the stability parameter. For example, $k_\delta=B\cdot A^{-C\alpha}$, where $k_\delta$ is the stability factor, α is the stability parameter, $k_\delta$ and α are both positive numbers, and A, B, and C are all constants, but this embodiment of the present application is not limited thereto, and a decreasing function relational expression in another form may be used.

Optionally, in another embodiment, in step 130, when the stability parameter is greater than or equal to a first threshold and is less than or equal to a second threshold, the stability factor $k_\delta$ may be determined according to the following function relational expression:

$$k_\delta=A\alpha+B,$$

where α is the stability parameter, A is a real number less than 0, and B is a real number greater than 0.

In this embodiment of the present application, when the stability parameter is greater than or equal to a first threshold α1 and is less than or equal to a second threshold α2, it may be determined that the stability factor $k_\delta$ is a linear decreasing function of the stability parameter α. Because the stability factor $k_\delta$ is the linear decreasing function of the stability parameter α, an algorithm for determining the stability factor $k_\delta$ is easier and is easily implemented.

It should be understood that, in this embodiment of the present application, the first threshold and the second threshold may be determined according to an empirical value, the first threshold α1 may range from 0 to 10 or from 1 to $10^{10}$, and the second threshold α2 may range from 0 to 10 or from 1 to $10^{10}$.

Optionally, in another embodiment, in 130, when the stability parameter is less than or equal to a third threshold, it is determined that the stability factor is a first constant, or when the stability parameter is greater than or equal to a fourth threshold, it is determined that the stability factor is a second constant, where the third threshold is less than the fourth threshold, both the first constant and the second constant are numbers greater than 0, and the first constant is greater than the second constant.

In this embodiment of the present application, the adaptive filter receives the first input signal. When the stability parameter of the first input signal is less than or equal to a third threshold $\alpha 3$, it may be determined that the stability factor is C1, or when the stability parameter of the first input signal is greater than or equal to a fourth threshold $\alpha 4$, it is determined that the stability factor is C2, where C1 and C2 are both numbers greater than 0, and C1 is greater than C2. When the stability parameter of the first input signal is greater than the third threshold $\alpha 3$ and is less than the fourth threshold $\alpha 4$, the stability factor $k_\delta$ may be determined according to the following linear relational expression, and the stability factor $k_\delta$ is a linear decreasing function of the stability parameter $\alpha$:

$$k_\delta = A\alpha + B,$$

where A is a real number less than 0, a value of A is a ratio of a difference between C2 and C1 to a difference between the fourth threshold $\alpha 4$ and the third threshold $\alpha 3$, that is, $$A = \frac{C2 - C1}{\alpha 4 - \alpha 3},$$

B is a real number greater than 0, and a value of B is a difference between the fourth threshold $\alpha 4$ and a product of the third threshold $\alpha 3$ and A, that is, $B = \alpha 4 - A \cdot \alpha 3$.

It should be understood that, in this embodiment of the present application, C1 and C2 may be determined according to an empirical value, C1 may range from $10^5$ to $10^{10}$, and C2 may range from $10^5$ to $10^{10}$. The third threshold and the fourth threshold may also be determined according to an empirical value, the third threshold $\alpha 3$ may range from 0 to 10 or from 1 to $10^{10}$, and the fourth threshold $\alpha 4$ may range from 0 to 10 or from 1 to $10^{10}$.

Figure 2:
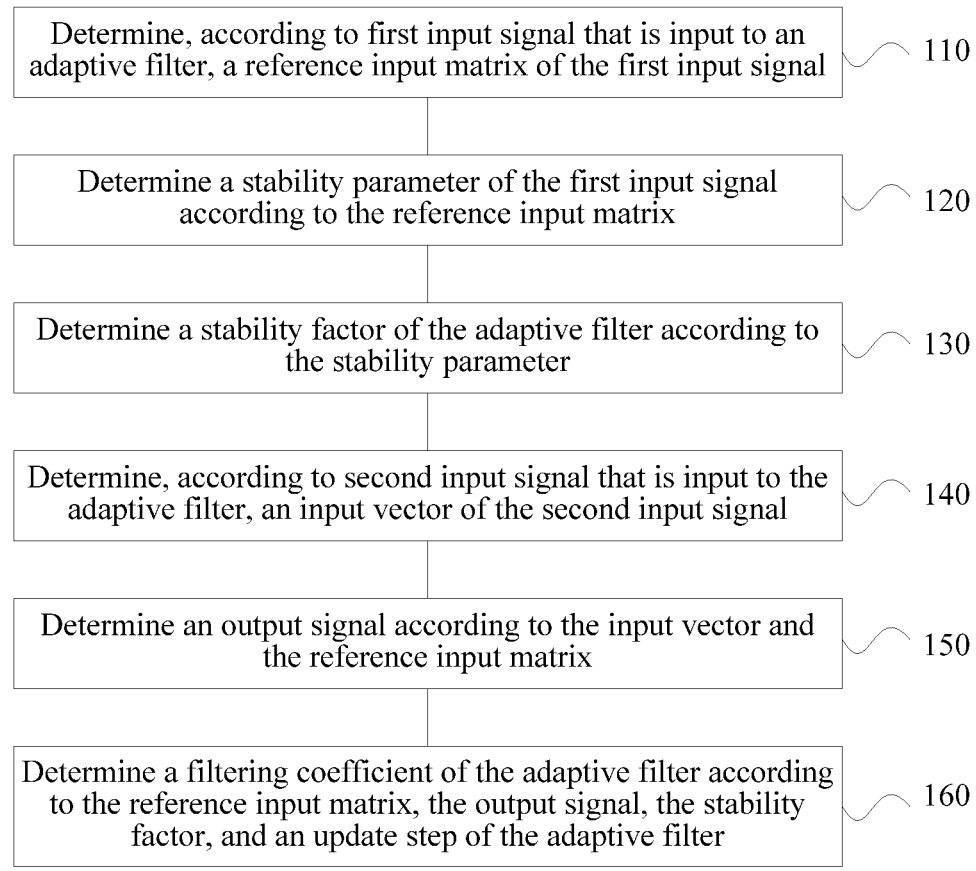
FIG. 2 is a schematic flowchart of a method for determining a stability factor of an adaptive filter according to another embodiment of the present application.

Optionally, in another embodiment, as shown in FIG. 2, the method 100 further includes the following steps:

Step 140: Determine, according to second input signal that are input to the adaptive filter, an input vector of the second input signal.

Step 150: Determine an output signal at a current time according to the input vector and the reference input matrix.

Step 160: Determine a filtering coefficient of the adaptive filter according to the reference input matrix, the output signal, the stability factor, and an update step of the adaptive filter.

In this embodiment of the present application, the apparatus for determining a stability factor of an adaptive filter may further obtain a second input signal that is input to the adaptive filter at the current time and second input signal that are input to the adaptive filter at the multiple historical times to construct an input vector, and determine an output signal at the current time according to the input vector, and then the apparatus may determine a coefficient of the adaptive filter according to the reference input matrix, the output signal, the stability factor, and an update step of the adaptive filter.

Therefore, according to the method for determining a stability factor of an adaptive filter provided in this embodiment of the present application, a stability factor of an adaptive filter is determined according to a stability parameter of first input signal that is determined according to a reference input matrix of the first input signal of the adaptive filter, so that the stability factor of the adaptive filter can be adaptively obtained according to a stability feature of the first input signal, and the adaptive filter can reach a balance between a convergence speed and steady state error performance.

It should be understood that, in this embodiment of the present application, a new filtering coefficient may be determined for the adaptive filter according to the stability factor determined at the current time, or the filtering coefficient of the adaptive filter at the current time may be updated according to the stability factor determined at the current time, and this embodiment of the present application is not limited thereto.

For example, the adaptive filter may use the NLMS algorithm, and an output signal e(n) at the $n^{th}$ time may be determined according to the following equation:

$$e(n) = d(n) - x(n)^T h(n),$$

where d(n) is an input vector constructed according to the second input signal, $x(n)^T$ is a transposed vector of a reference input vector x(n) at the $n^{th}$ time, and h(n) is a coefficient of the adaptive filter at the $n^{th}$ time, and $$h(n) = [h_n(0), \ldots, h_n(L-1)]^T,$$

where L is the length of the adaptive filter.

A coefficient h(n+1) of the adaptive filter at an $(n+1)^{th}$ time is determined according to the reference input vector x(n), the output signal e(n), the stability factor $k_\delta$, and an update step $\mu$ of the adaptive filter, and the filtering coefficient h(n+1) of the adaptive filter may be determined according to the following equation:

$$h(n+1) = h(n) + \frac{\mu}{k_\delta + \|x(n)\|^2} x(n) \cdot e(n);$$

or the coefficient h(n) of the adaptive filter at the $n^{th}$ time may be updated according to the reference input vector x(n), the output signal e(n), the stability factor $k_\delta$, and an update step $\mu$ of the adaptive filter, and an updated filtering coefficient h(n+1) of the adaptive filter may be determined according to the equation above, where h(n) is the coefficient of the adaptive filter at the $n^{th}$ time, h(n+1) is the coefficient of the adaptive filter at the $(n+1)^{th}$ time, $\mu$ is the update step of the adaptive filter, $k_\delta$ is the stability factor of the adaptive filter, $\|x(n)\|^2$ is a square of 2-norm of the reference input vector x(n) at the $n^{th}$ time, and e(n) is the output signal.

For another example, the adaptive filter may use the APA algorithm, and an output signal e(n) at the $n^{th}$ time may be determined according to the following equations:

$$e(n) = [e(n), e(n-1), \ldots, e(n-p+1)]^T, \text{ and } e(n) = d(n) - X(n)^T h(n),$$

where $X(n)^T$ is a transposed matrix of the reference input matrix X(n) at the $n^{th}$ time, d(n) is an input vector constructed according to the second input signal, and h(n) is a coefficient of the adaptive filter at the $n^{th}$ time, and $$h(n) = [h_n(0), \ldots, h_n(L-1)]^T,$$

where L is the length of the adaptive filter.

A coefficient h(n+1) of the adaptive filter at an $(n+1)^{th}$ time is determined according to the reference input matrix X(n), the output signal e(n), the stability factor $k_\delta$, and an update step μ of the adaptive filter, and the filtering coefficient h(n+1) of the adaptive filter may be determined according to the following equation:

$$h(n+1)=h(n)+\mu X(n)[X(n)^T X(n)+k_\delta I]^{-1} \cdot e(n); \text{ or}$$

the coefficient h(n) of the adaptive filter at the $n^{th}$ time may be updated according to the reference input matrix X(n), the output signal e(n), the stability factor $k_\delta$, and an update step μ of the adaptive filter, and an updated filtering coefficient h(n+1) of the adaptive filter may be determined according to the equation above, where h(n) is the coefficient of the adaptive filter at the $n^{th}$ time, h(n+1) is the coefficient of the adaptive filter at the $(n+1)^{th}$ time, μ is the update step of the adaptive filter, $k_\delta$ is the stability factor of the adaptive filter, X(n) is the reference input matrix at the $n^{th}$ time, e(n) is the output signal, I is an identity matrix, and $[\ ]^{-1}$ indicates that an inverse operation is performed on the matrix.

The technical solution of the method for determining a stability factor of an adaptive filter according to this embodiment of the present application is described below in further detail with reference to FIG. 3 and FIG. 4 using an example in which the filtering coefficient of the adaptive filter is determined.

Figure 3:
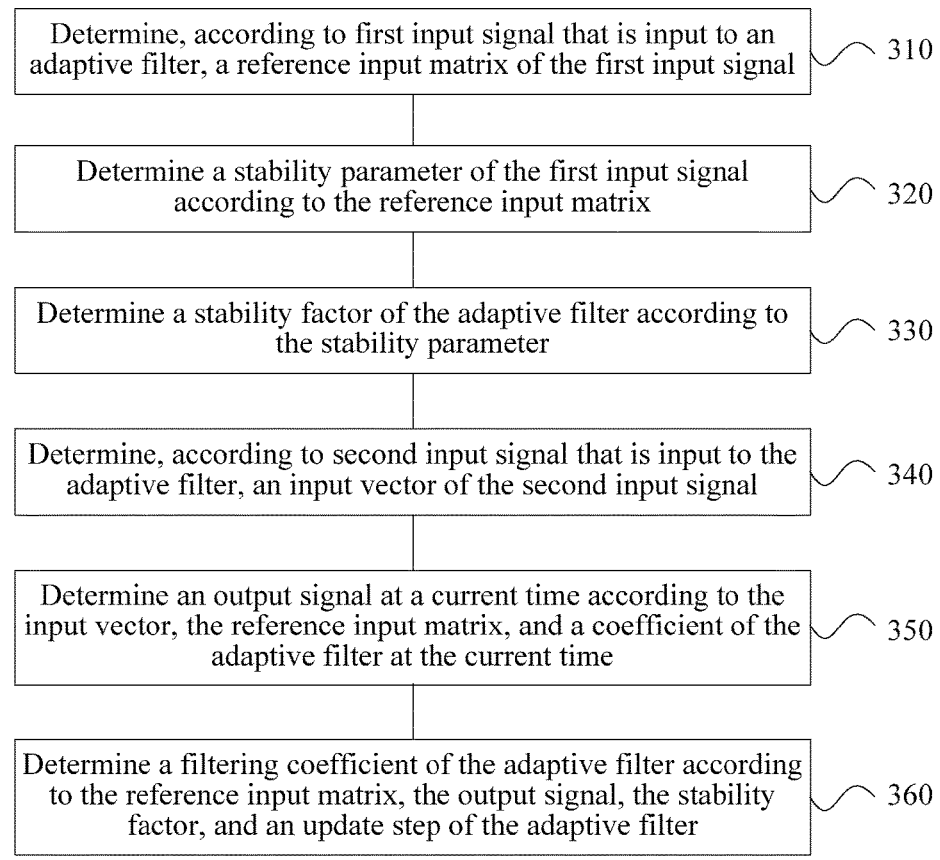
FIG. 3 is a schematic flowchart of a method for determining a filtering coefficient of an adaptive filter according to an embodiment of the present application.

FIG. 3 is a schematic flowchart of a method 300 for determining a filtering coefficient of an adaptive filter according to an embodiment of the present application. The adaptive filter may be an adaptive filter in an echo cancellation algorithm in which an APA algorithm is used, and the method 300 shown in FIG. 3 includes the following steps:

Step 310: Determine, according to first input signal that are input to an adaptive filter, a reference input matrix of the first input signal.

Before the reference input matrix of the first input signal is determined according to the first input signal that are input to the adaptive filter, a $K^{th}$ frame of first input signal R that is input to the adaptive filter is obtained. The $K^{th}$ frame of first input signal R may be expressed as:

$$R=[R((k-1)^*L_f), \ldots, R((k-1)^*L_f+L_f-1)],$$

where $L_f$ represents a frame length of each frame of first input signal, for example, $L_f$=320, but this embodiment of the present application is not limited thereto, and $L_f$ may be another positive integer. It should be noted that, in the $K^{th}$ frame of first input signal R, $L_f$ is a quantity of samples of first input signal included in the $K^{th}$ frame of first input signal R, that is, the first input signal R is a vector of $L_f \times 1$.

An affine projection order in the APA algorithm is p, and the $K^{th}$ frame of first input signal R may be divided into $L_f/p$ subframes. For example, p=8, and the $K^{th}$ frame of first input signal R may include 40 subframes of first input signal, but this embodiment of the present application is not limited thereto, and a suitable positive integer may be selected as the affine projection order p according to a design requirement of the APA algorithm.

In this embodiment of the present application, an $m^{th}$ subframe of first input signal $R_m$ in the $K^{th}$ frame of first input signal R may be used as the first input signal at an $n^{th}$ time. The $m^{th}$ subframe of first input signal $R_m$ may be expressed as:

$$R_m=[R((k-1)^*L_f+(m-1)^*p), \ldots, R((k-1)^*L_f+m^*p-1)].$$

A reference input matrix X(n) of first input signal may be constructed according to the $m^{th}$ subframe of first input signal $R_m$ in the $K^{th}$ frame of first input signal R and first input signal that are input to the adaptive filter at multiple historical times:

$$X(n) = \begin{bmatrix} R(n) & \cdots & R(n-p+1) \\ \vdots & \ddots & \vdots \\ R(n-L+1) & \cdots & R(n-p-L+2) \end{bmatrix},$$

where $n=(k-1)^*L_f+(m-1)^*p$, L is a length of the adaptive filter, and p is an order of the adaptive filter and is a quantity of columns of the reference input matrix X(n). For example, the order of the adaptive filter may be set to 8, the length of the adaptive filter may be set to 200, and a reference input matrix constructed according to a first subframe of first input signal in a first frame of first input signal and the first input signal that are input to the adaptive filter at the historical times is expressed as:

$$X(0) = \begin{bmatrix} R(0) & R(-1) & R(-2) & \cdots & R(-7) \\ R(-1) & R(-2) & R(-3) & \cdots & R(-8) \\ \vdots & \vdots & \vdots & & \vdots \\ \vdots & \vdots & \vdots & & \vdots \\ R(-199) & R(-200) & R(-201) & \cdots & R(-206) \end{bmatrix}.$$

Step 320: Determine a stability parameter of the first input signal according to the reference input matrix determined in step 310.

The reference input matrix may be transposed, to obtain a transposed matrix; the transposed matrix is multiplied by the reference input matrix, to obtain a first matrix; and a determinant of the first matrix is determined as a stability parameter α. For example, the stability parameter α of the first input signal may be determined according to the following equation, that is, the stability parameter α is a parameter for representing an autocorrelation characteristic of the reference input matrix X(n) constructed according to the first input signal:

$$\alpha=|X(n)^T \cdot X(n)|,$$

X(n) is a reference input matrix at an $n^{th}$ time, and $X(n)^T$ is a transposed matrix of the reference input matrix X(n).

Alternatively, the reference input matrix may be transposed, to obtain a transposed matrix; a sum of a positive real number and a result of multiplying the transposed matrix by the reference input matrix is determined as a first matrix; and a value of a determinant of the first matrix is determined as the stability parameter of the first input signal, so that the value of the determinant may be a positive number that is not zero. For example, the stability parameter α of the first input signal may be determined according to the following equation:

$$\alpha=|X(n)^T \cdot X(n)+\delta|,$$

where δ is a real number, and a value of δ may range from 1 to $10^5$. For example, the value of δ may be $10^5$.

Alternatively, the reference input matrix may be transposed, to obtain a transposed matrix; the transposed matrix is multiplied by the reference input matrix, to obtain a second matrix; and a result obtained by taking a logarithm of a determinant of the second matrix is determined as a stability parameter α. For example, the stability parameter α of the first input signal may be determined according to the following equation, that is, the stability parameter α is a parameter for representing an autocorrelation characteristic of the reference input matrix X(n) constructed according to the first input signal:

$$\alpha = \log|X(n)^T \cdot X(n)|,$$

X(n) is a reference input matrix at an $n^{th}$ time, and $X(n)^T$ is a transposed matrix of the reference input matrix X(n).

It should be understood that, in this embodiment of the present application, a base of the logarithm may be 10, that is, $\alpha=\lg|X(n)^T \cdot X(n)|$, or may be e, that is, $\alpha=\ln|X(n)^T \cdot X(n)|$, or may be another constant, which is not limited in this embodiment of the present application.

Alternatively, the reference input matrix may be transposed, to obtain a transposed matrix; a sum of a positive real number and a result of multiplying the transposed matrix by the reference input matrix is determined as a second matrix; and a result obtained by taking a logarithm of a value of a determinant of the second matrix is determined as the stability parameter of the first input signal, so that the value of the determinant may be a positive number that is not zero. For example, the stability parameter α of the first input signal may be determined according to the following equation:

$$\alpha = \log|X(n)^T \cdot X(n) + \delta|,$$

where δ is a real number, and a value of δ may range from 1 to $10^5$. For example, the value of δ may be $10^5$.

Step 330: Determine a stability factor of the adaptive filter according to the stability parameter determined in step 320.

When the stability parameter is less than or equal to a third threshold α3, it is determined that the stability factor is a first constant C1, or when the stability parameter is greater than or equal to a fourth threshold α4, it is determined that the stability factor is a second constant C2, where α3 is less than α4, C1 and C2 are both numbers greater than 0, and C1 is greater than C2. When the stability parameter is greater than the third threshold α3 and is less than the fourth threshold α4, the stability factor may be determined according to the stability parameter and a decreasing function relation between the stability factor and the stability parameter. For example, the stability factor $k_\delta$ may be determined according to the following function relational expression:

$$k_\delta = A\alpha + B,$$

where α is the stability parameter, A is a real number less than 0, and B is a real number greater than 0.

It should be understood that, in this embodiment of the present application, when the stability parameter of the first input signal is greater than the third threshold and is less than the fourth threshold, it may also be determined that the stability factor is a function of an inverse relationship of the stability parameter. For example, $k_\delta = B \cdot A^{-C\alpha}$, where $k_\delta$ is the stability factor, α is the stability parameter, and A, B, and C are all constants, but this embodiment of the present application is not limited thereto.

To sum up, in this embodiment of the present application, the stability factor $k_\delta$ may be determined according to the following equation:

$$k_\delta = \begin{cases} C2, & \alpha \geq \alpha 4 \\ A\alpha + B, & \alpha 3 < \alpha < \alpha 4, \\ C1, & \alpha \leq \alpha 3 \end{cases}$$

where α3 represents the third threshold, α4 represents the fourth threshold, α3<α4, $$A = \frac{C2 - C1}{\alpha 4 - \alpha 3},$$

and B=α4−A·α3.

It should be understood that, in this embodiment of the present application, C1 and C2 may be determined according to an empirical value, C1 may range from $10^5$ to $10^{10}$, and C2 may range from $10^5$ to $10^{10}$. For example, a value of C1 may be $10^6$, and a value of C2 may be $5 \times 10^7$.

It should be further understood that, in this embodiment of the present application, the third threshold and the fourth threshold may be determined according to an empirical value. When $\alpha=|X(n)^T \cdot X(n)|$ or $\alpha=|X(n)^T \cdot X(n)+\delta|$, the third threshold α3 may range from 0 to $10^{10}$, the fourth threshold α4 may range from 0 to $10^{10}$, and α3<α4. When $\alpha=\log|X(n)^T \cdot X(n)|$ or $\alpha=\log|X(n)^T \cdot X(n)+\delta|$, the third threshold α3 may range from 1 to 10, the fourth threshold α4 may range from 1 to 10, and α3<α4. For example, a value of α3 may be 1.5, a value of α4 may be 2.5, and the value of δ may be $10^5$.

Step 340: Determine, according to second input signal that is input to the adaptive filter, an input vector of the second input signal.

Before the input vector of the second input signal is determined according to the second input signal that are input to the adaptive filter, a $K^{th}$ frame of second input signal S that is input to the adaptive filter is obtained. The $K^{th}$ frame of second input signal S may be expressed as:

$$S=[S((k-1)*L_f), \ldots, S((k-1)*L_f + L_f - 1)],$$

where $L_f$ represents a frame length of each frame of second input signal, for example, $L_f$=320, but this embodiment of the present application is not limited thereto, and $L_f$ may be another positive integer. It should be noted that, in the $K^{th}$ frame of second input signal S, $L_f$ is a quantity of samples of second input signal included in the $K^{th}$ frame of second input signal S, that is, the second input signal S is a vector of $L_f \times 1$.

The affine projection order in the APA algorithm is p, and the $K^{th}$ frame of second input signal S may be divided into $L_f / p$ subframes. For example, p=8, and the $K^{th}$ frame of second input signal S may include 40 subframes of second input signal, but this embodiment of the present application is not limited thereto, and a suitable positive integer may be selected as the affine projection order p according to a design requirement of the APA algorithm.

In this embodiment of the present application, an $m^{th}$ subframe of second input signal $S_m$ in the $K^{th}$ frame of second input signal S may be used as a second input signal at the $n^{th}$ time. The $m^{th}$ subframe of second input signal $S_m$ may be expressed as:

$$S_m = [S((k-1)*L_f + (m-1)*p), \ldots, S((k-1)*L_f + m*p - 1)].$$

An input vector d(n) may be constructed according to the $m^{th}$ subframe of second input signal $S_m$ in the $K^{th}$ frame of second input signal S:

$$d(n) = [S(n), \ldots, S(n-p+1)]^T,$$

where $n=(k-1)*L_f+(m-1)*p$, p is the order of the adaptive filter and is a quantity of rows of the input vector d(n). For example, the order of the adaptive filter may be set to 8, the length of the adaptive filter may be set to 200, and an input vector constructed according to a first subframe of second input signal in a first frame of second input signal and second input signal that are input to the adaptive filter at historical times may be expressed as:

$$d(0) = [S(0), S(-1), \ldots, S(-7)]^T.$$

Step 350: Determine an output signal at a current time according to the reference input matrix determined in step 310, the input vector determined in step 340, and a coefficient of the adaptive filter at the current time.

An output signal $e(n)$ at the $n^{th}$ time may be determined according to the reference input matrix $X(n)$, the input vector $d(n)$, and the coefficient of the adaptive filter at the current time. For example, the output signal $e(n)$ may be determined according to the following equations:

$$e(n)=[e(n),e(n-1),\ldots,e(n-p+1)]^T, \text{ and}$$

$$e(n)=d(n)-X(n)^T h(n),$$

where $X(n)^T$ is a transposed matrix of the reference input matrix $X(n)$ at the $n^{th}$ time, $d(n)$ is the input vector at the $n^{th}$ time, and $h(n)$ is a coefficient of the adaptive filter at the $n^{th}$ time, and $$h(n)=[h_n(0),\ldots,h_n(L-1)]^T,$$

where L is the length of the adaptive filter.

Step 360: Determine a filtering coefficient of the adaptive filter according to the reference input matrix determined in step 310, the stability factor determined in step 330, the output signal determined in step 350, and an update step of the adaptive filter.

A coefficient $h(n+1)$ of the adaptive filter at an $(n+1)^{th}$ time may be determined according to the output signal $e(n)$, the stability factor $k_\delta$, and the update step of the adaptive filter, and the filtering coefficient $h(n+1)$ of the adaptive filter may be determined according to the following equation:

$$h(n+1)=h(n)+\mu X(n)[X(n)^T X(n)+k_\delta I]^{-1} e(n),$$

where $h(n)$ is the coefficient of the adaptive filter at the $n^{th}$ time, $h(n+1)$ is the coefficient of the adaptive filter at the $(n+1)^{th}$ time, $\mu$ is the update step of the adaptive filter, $k_\delta$ is the stability factor of the adaptive filter, $X(n)$ is the reference input matrix at the $n^{th}$ time, $e(n)$ is an output signal vector, I is an identity matrix, and $[\ ]^{-1}$ indicates that an inverse operation is performed on the matrix.

Therefore, according to the method for determining a stability factor of an adaptive filter provided in this embodiment of the present application, a stability factor of an adaptive filter is determined according to a stability parameter of first input signal that is determined according to a reference input matrix of the first input signal of the adaptive filter, so that the stability factor of the adaptive filter can be adaptively obtained according to a stability feature of the first input signal, and the adaptive filter can reach a balance between a convergence speed and steady state error performance.

It should be understood that, in this embodiment of the present application, the first input signal may be a signal that is transmitted from a remote end and that is played by a speaker, and the second input signal may be a signal actually collected by a near-end microphone, but this embodiment of the present application is not limited thereto. For example, when the adaptive filter uses the APA algorithm and is applied to another scenario, the first input signal may be a reference signal, and the second input signal may be an expected signal.

Figure 4:
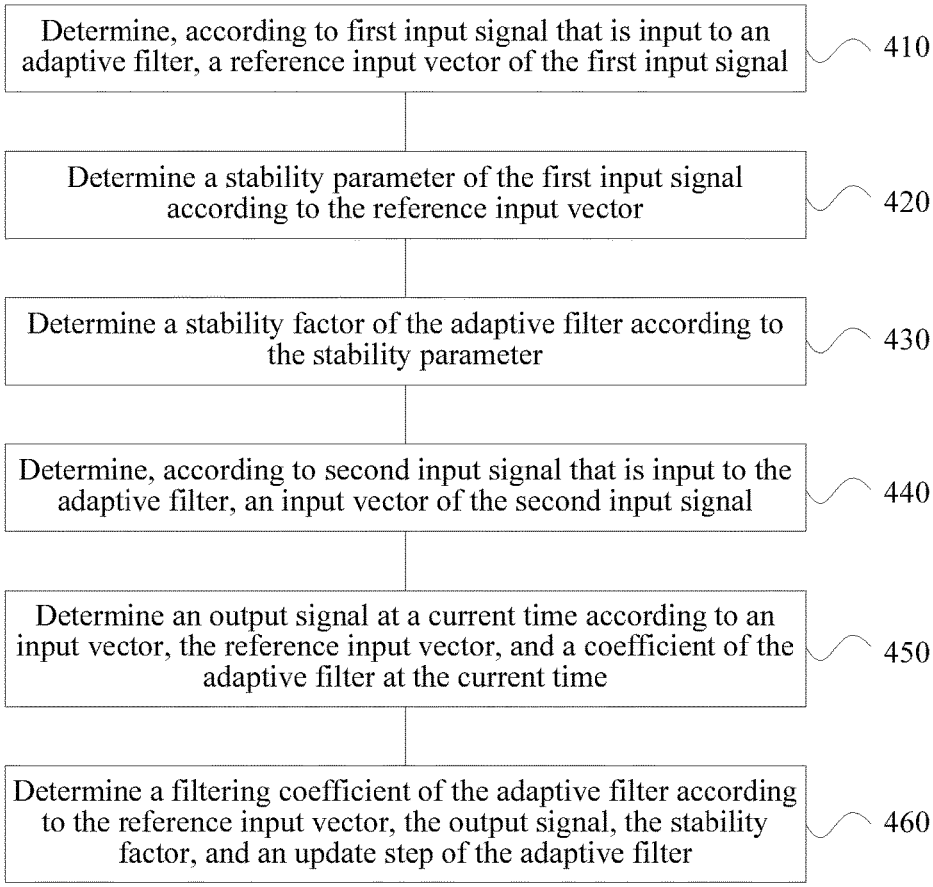
FIG. 4 is a schematic flowchart of a method for determining a filtering coefficient of an adaptive filter according to another embodiment of the present application.

FIG. 4 is a schematic flowchart of a method 400 for determining a filtering coefficient of an adaptive filter according to another embodiment of the present application. The adaptive filter may be an adaptive filter in an echo cancellation algorithm in which an NLMS algorithm is used, and the method 400 shown in FIG. 4 includes the following steps:

Step 410: Determine, according to first input signal that is input to an adaptive filter, a reference input vector of the first input signal.

Before the reference input vector of the first input signal is determined according to the first input signal that is input to the adaptive filter, a $K^{th}$ frame of first input signal R that is input to the adaptive filter is obtained. The $K^{th}$ frame of first input signal R may be expressed as:

$$R=[R((k-1)*L_f),\ldots,R((k-1)*L_f+L_f-1)],$$

where $L_f$ represents a frame length of each frame of first input signal, for example, $L_f=320$, but this embodiment of the present application is not limited thereto, and $L_f$ may be another positive integer. It should be noted that, in the $K^{th}$ frame of first input signal R, $L_f$ is a quantity of samples of first input signal included in the $K^{th}$ frame of first input signal R, that is, the first input signal R is a first input signal vector of $L_f \times 1$.

A frame length of the $K^{th}$ frame of first input signal R may be $L_f=320$, and the $K^{th}$ frame of first input signal R includes 320 sampling points. In this embodiment of the present application, a first input signal vector $R_m$ corresponding to an $m^{th}$ sampling point of the $K^{th}$ frame of first input signal R may be used as a first input signal at an $n^{th}$ time. The first input signal vector $R_m$ of the $m^{th}$ sampling point may be expressed as:

$$R_m=[R((k-1)*L_f+m),\ldots,R((k-1)*L_f+m+L_f-1)].$$

A reference input matrix $x(n)$ of first input signal may be constructed according to the first input signal $R_m$ corresponding to the $m^{th}$ sampling point of the $K^{th}$ frame of first input signal R and first input signal that are input to the adaptive filter at multiple historical times:

$$x(n)=[x(n),x(n-1),\ldots,x(n-L+1)]^T,$$

where $n=(k-1)*L_f+m$, and L is a length of the adaptive filter. For example, the length of the adaptive filter may be set to 200, and a reference input vector constructed according to a first input signal corresponding to a first sampling point of a first frame of first input signal and the first input signal that are input to the adaptive filter at the historical times may be expressed as:

$$x(0)=[x(0),x(-1),\ldots,x(-199)]^T.$$

Step 420: Determine a stability parameter of the first input signal according to the reference input vector determined in step 410.

The reference input vector may be transposed, to obtain a transposed vector; the transposed vector is multiplied by the reference input vector, to obtain a first matrix; and a determinant of the first matrix is determined as a stability parameter $\alpha$ of the first input signal at the $n^{th}$ time. For example, the stability parameter $\alpha$ of the first input signal at the $n^{th}$ time may be determined according to the following equation, that is, the stability parameter $\alpha$ is a parameter for representing an autocorrelation characteristic of a reference input vector $x(n)$ constructed according to the first input signal:

$$\alpha=|x(n)^T x(n)|,$$

where $x(n)$ is a reference input vector at the $n^{th}$ time, and $x(n)^T$ is a transposed vector of the reference input vector $x(n)$.

Alternatively, the reference input vector may be transposed, to obtain a transposed vector; a sum of a positive real number and a result of multiplying the transposed vector by the reference input vector is determined as a first matrix; and a value of a determinant of the first matrix is determined as the stability parameter of the first input signal, so that the value of the determinant may be a positive number that is not zero. For example, the stability parameter α of the first input signal may be determined according to the following equation:

$$\alpha = |x(n)^T \cdot x(n) + \delta|,$$

where δ is a real number, and a value of δ may range from 1 to $10^5$. For example, the value of δ may be $10^5$.

Alternatively, the reference input vector may be transposed, to obtain a transposed vector, a product of the transposed vector and the reference input vector is determined as a second matrix, and a result obtained by taking a logarithm of a determinant of the second matrix is determined as a stability parameter α of the first input signal. For example, the stability parameter α of the first input signal may be determined according to the following equation, that is, the stability parameter α is an autocorrelation parameter of the first input signal at the $n^{th}$ time:

$$\alpha = \log|x(n)^T \cdot x(n)|,$$

where x(n) is a reference input vector at the $n^{th}$ time, and $x(n)^T$ is a transposed vector of the reference input vector x(n).

It should be understood that, in this embodiment of the present application, a base of the logarithm may be 10, that is, $\alpha = \lg|x(n)^T \cdot x(n)|$, or may be e, that is, $\alpha = \ln|x(n)^T \cdot x(n)|$, or may be another constant, which is not limited in this embodiment of the present application.

Alternatively, the reference input vector may be transposed, to obtain a transposed vector; a sum of a positive real number and a result of multiplying the transposed vector by the reference input vector is determined as a second matrix; and a result obtained by taking a logarithm of a value of a determinant of the second matrix is determined as the stability parameter of the first input signal, so that the value of the determinant may be a positive number that is not zero. For example, the stability parameter α of the first input signal may be determined according to the following equation:

$$\alpha = \log|x(n)^T \cdot x(n) + \delta|,$$

where δ is a real number, and a value of δ may range from 1 to $10^5$. For example, the value of δ may be $10^5$.

Step 430: Determine a stability factor of the adaptive filter according to the stability parameter determined in step 420.

When the stability parameter is less than or equal to a third threshold α3, it is determined that the stability factor is a first constant C1, or when the stability parameter is greater than or equal to a fourth threshold α4, it is determined that the stability factor is a second constant C2, where α3 is less than α4, C1 and C2 are both numbers greater than 0, and C1 is greater than C2. When the stability parameter is greater than the third threshold α3 and is less than the fourth threshold α4, the stability factor may be determined according to the stability parameter and a decreasing function relation between the stability factor and the stability parameter. For example, the stability factor $k_\delta$ may be determined according to the following decreasing function relational expression:

$$k_\delta = A\alpha + B,$$

where α is the stability parameter, A is a real number less than 0, and B is a real number greater than 0.

It should be understood that, in this embodiment of the present application, when the stability parameter of the first input signal is greater than the third threshold and is less than the fourth threshold, it may also be determined that the stability factor is a function of an inverse relationship of the stability parameter. For example, $k_\delta = B \cdot A^{-C\alpha}$, where $k_\delta$ is the stability factor, α is the stability parameter, and A, B, and C are all constants, but this embodiment of the present application is not limited thereto.

To sum up, in this embodiment of the present application, the stability factor $k_\delta$ may be determined according to the following equation:

$$k_\delta = \begin{cases} C2, & \alpha \geq \alpha 4 \\ A\alpha + B, & \alpha 3 < \alpha < \alpha 4, \\ C1, & \alpha \leq \alpha 3 \end{cases}$$

where α3 represents the third threshold, α4 represents the fourth threshold, α3<α4, $$A = \frac{C2 - C1}{\alpha 4 - \alpha 3},$$

and B=α4−A·α3.

It should be understood that, in this embodiment of the present application, C1 and C2 may be determined according to an empirical value, C1 may range from $10^5$ to $10^{10}$, and C2 may range from $10^5$ to $10^{10}$. For example, a value of C1 may be $10^6$, and a value of C2 may be $5 \times 10^7$.

It should be further understood that, in this embodiment of the present application, the third threshold and the fourth threshold may be determined according to an empirical value. When $\alpha = |X(n)^T \cdot X(n)|$ or $\alpha = |X(n)^T \cdot X(n) + \delta|$, the third threshold α3 may range from 0 to $10^{10}$, the fourth threshold α4 may range from 0 to $10^{10}$, and α3<α4. When $\alpha = \log|X(n)^T \cdot X(n)|$ or $\alpha = \log|X(n)^T \cdot X(n) + \delta|$, the third threshold α3 may range from 1 to 10, the fourth threshold α4 may range from 1 to 10, and α3<α4. For example, a value of α3 may be 1.5, a value of α4 may be 2.5, and the value of δ may be $10^5$.

Step 440: Determine, according to second input signal that are input to the adaptive filter, an input vector of the second input signal.

Before the input vector of the second input signal is obtained according to the second input signal that are input to the adaptive filter, a $K^{th}$ frame of second input signal S that is input to the adaptive filter is obtained. The $K^{th}$ frame of second input signal S may be expressed as:

$$S = [S((k-1)*L_f), \ldots, S((k-1)*L_f + L_f - 1)],$$

where $L_f$ represents a frame length of each frame of second input signal, for example, $L_f = 320$, but this embodiment of the present application is not limited thereto, and $L_f$ may be another positive integer. It should be noted that, in the $K^{th}$ frame of second input signal S, $L_f$ is a quantity of samples of second input signal included in the $K^{th}$ frame of second input signal, that is, the second input signal S is a second input signal vector of $L_f \times 1$.

A frame length of the $K^{th}$ frame of second input signal S may be $L_f = 320$, and the $K^{th}$ frame of second input signal S includes 320 sampling points. In this embodiment of the present application, a second input signal vector $S_m$ corresponding to an $m^{th}$ sampling point of the $K^{th}$ frame of second input signal S may be used as the second input signal at the $n^{th}$ time. The second input signal vector $S_m$ corresponding to the $m^{th}$ sampling point may be expressed as:

$$S_m = [S((k-1)*L_f + m), \ldots, S((k-1)*L_f + m + L_f - 1)].$$

An input vector d(n) may be constructed according to the second input signal $S_m$ corresponding to the $m^{th}$ sampling point of the $K^{th}$ frame of second input signal S:

$$d(n)=[S(n)]^T,$$

where $n=(k-1)*L_f+m$.

Step 450: Determine an output signal at a current time according to the reference input vector determined in step 410, the input vector determined in step 440, and a coefficient of the adaptive filter at the current time.

An output signal e(n) at the $n^{th}$ time may be determined according to the reference input vector x(n), the input vector d(n), and the coefficient of the adaptive filter at the current time. For example, the output signal e(n) may be determined according to the following equation:

$$e(n)=d(n)-x(n)^T h(n),$$

where $X(n)^T$ is the transposed matrix of the reference input matrix x(n) at the $n^{th}$ time, d(n) is the input vector at the $n^{th}$ time, and h(n) is a coefficient of the adaptive filter at the $n^{th}$ time, and $$h(n)=[h_n(0), \ldots , h_n(L-1)]^T,$$

where L is the length of the adaptive filter.

Step 460: Determine a coefficient of the adaptive filter according to the reference input matrix determined in step 410, the stability factor determined in step 430, the output signal determined in 450, and an update step of the adaptive filter.

A coefficient h(n+1) of the adaptive filter at an $(n+1)^{th}$ time may be determined according to the output signal e(n), the stability factor $k_\delta$, and the update step of the adaptive filter, and the filtering coefficient h(n+1) of the adaptive filter may be determined according to the following equation:

$$h(n+1) = h(n) + \frac{\mu}{k_\delta + \|x(n)\|^2} x(n) \cdot e(n),$$

where h(n) is the coefficient of the adaptive filter at the $n^{th}$ time, h(n+1) is the coefficient of the adaptive filter at the $(n+1)^{th}$ time, $\mu$ is the update step of the adaptive filter, $k_\delta$ is the stability factor of the adaptive filter, $\|x(n)\|^2$ is a square of 2-norm of the reference input vector x(n) at the $n^{th}$ time, and e(n) is the output signal.

Therefore, according to the method for determining a stability factor of an adaptive filter provided in this embodiment of the present application, a stability factor of an adaptive filter is determined according to a stability parameter of first input signal that is determined according to a reference input matrix of the first input signal of the adaptive filter, so that the stability factor of the adaptive filter can be adaptively obtained according to a stability feature of the first input signal, and the adaptive filter can reach a balance between a convergence speed and steady state error performance.

It should be understood that, in this embodiment of the present application, the first input signal may be a signal that is transmitted from a remote end and that is played by a speaker, and the second input signal may be a signal actually collected by a near-end microphone, but this embodiment of the present application is not limited thereto. For example, when the adaptive filter uses the NLMS algorithm and is applied to another scenario, the first input signal may be a reference signal, and the second input signal may be an expected signal.

A method for determining a stability factor of an adaptive filter according to embodiments of the present application is described in detail above with reference to FIG. 1 to FIG. 4, and an apparatus for determining a stability factor of an adaptive filter according to embodiments of the present application is described in detail below with reference to FIG. 5 to FIG. 8.

Figure 5:
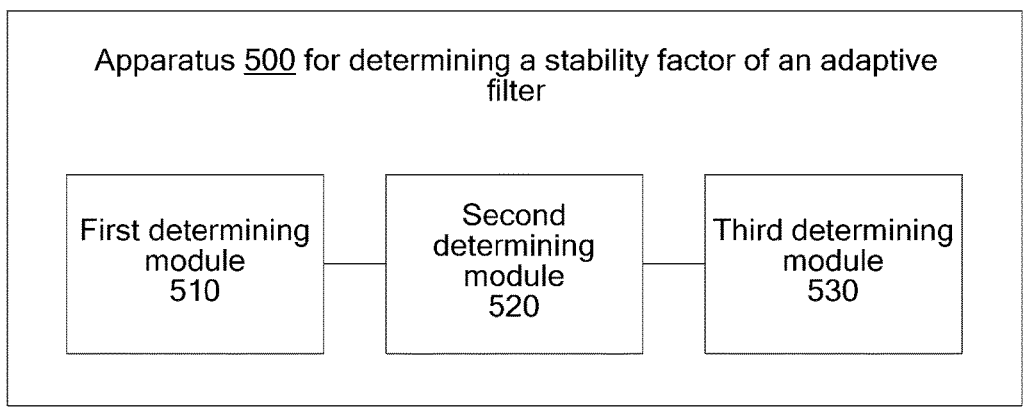
FIG. 5 is a structural block diagram of an apparatus for determining a stability factor of an adaptive filter according to an embodiment of the present application.

FIG. 5 is a structural block diagram of an apparatus 500 for determining a stability factor of an adaptive filter according to an embodiment of the present application. The apparatus 500 shown in FIG. 5 includes a first determining module 510, a second determining module 520, and a third determining module 530, where the first determining module 510 is configured to determine, according to first input signal that are input to an adaptive filter, a reference input matrix of the first input signal; the second determining module 520 is configured to determine a stability parameter of the first input signal according to the reference input matrix determined by the first determining module 510; and the third determining module 530 is configured to determine a stability factor of the adaptive filter according to the stability parameter determined by the second determining module 520.

Therefore, according to the apparatus for determining a stability factor of an adaptive filter provided in this embodiment of the present application, a stability factor of an adaptive filter is determined according to a stability parameter of first input signal that is determined according to a reference input matrix of the first input signal that are input to the adaptive filter, so that the stability factor of the adaptive filter can be adaptively obtained according to a stability feature of the first input signal, and the adaptive filter can reach a balance between a convergence speed and steady state error performance.

Optionally, in an embodiment, the third determining module 530 is configured to determine the stability factor according to the stability parameter and a decreasing function relation between the stability factor and the stability parameter. In other words, a value of the stability factor decreases when a value of the stability parameter increases.

It should be understood that, in this embodiment of the present application, it may be determined that the stability factor is a linear decreasing function of the stability parameter, or may be determined that the stability factor is a function of an inverse relationship of the stability parameter. For example, $k_\delta = B \cdot A^{-C\alpha}$, where $k_\delta$ is the stability factor, $\alpha$ is the stability parameter, $k_\delta$ and $\alpha$ are both positive numbers, and A, B, and C are all constants, but this embodiment of the present application is not limited thereto, and a decreasing function relational expression in another form may be used.

Optionally, in another embodiment, the third determining module 530 includes a first determining unit 531 configured to, when the stability parameter determined by the second determining module 520 is greater than or equal to a first threshold and is less than or equal to second threshold, determine the stability factor according to the following function relational expression:

$$k_\delta = A\alpha + B,$$

where $k_\delta$ is the stability factor, $\alpha$ is the stability parameter, A is a real number less than 0, and B is a real number greater than 0.

In this embodiment of the present application, when the stability parameter of the first input signal is greater than or equal to a first threshold $\alpha 1$ and is less than or equal to a second threshold $\alpha 2$, it may be determined that the stability factor $k_\delta$ is a linear decreasing function of the stability parameter $\alpha$. Because the stability factor $k_\delta$ is the linear decreasing function of the stability parameter $\alpha$, an algorithm for determining the stability factor $k_\delta$ is easier and is easily implemented.

It should be understood that, in this embodiment of the present application, the first threshold and the second threshold may be determined according to an empirical value, the first threshold $\alpha 1$ may range from 0 to 10 or from 1 to $10^{10}$, and the second threshold $\alpha 2$ may range from 0 to 10 or from 1 to $10^{10}$.

Figure 6:
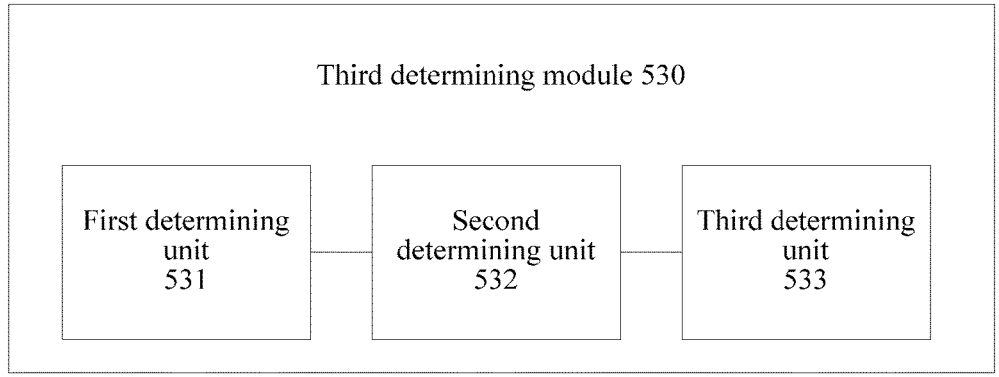
FIG. 6 is a structural block diagram of a third determining module according to an embodiment of the present application.

Optionally, in another embodiment, as shown in FIG. 6, the third determining module 530 includes a second determining unit 532 and a third determining unit 533, where the second determining unit 532 is configured to, when the stability parameter determined by the second determining module 520 is less than or equal to a third threshold, determine that the stability factor is a first constant; and the third determining unit 533 is configured to, when the stability parameter determined by the second determining module 520 is greater than or equal to a fourth threshold, determine that the stability factor is a second constant, where the third threshold is less than the fourth threshold, both the first constant and the second constant are numbers greater than 0, and the first constant is greater than the second constant.

Optionally, in another embodiment, the second determining module includes a first determining unit configured to transpose the reference input matrix, to obtain a transposed matrix; a multiplication unit configured to multiply the transposed matrix obtained by the first determining unit by the reference input matrix, to obtain a first matrix; and a second determining unit configured to determine a value of a determinant of the first matrix obtained by the multiplication unit as the stability parameter.

Alternatively, the first determining unit may be configured to determine a sum of a positive real number and a product of the transposed matrix of the reference input matrix and the reference input matrix as a first matrix; and the second determining unit is configured to determine a value of a determinant of the first matrix determined by the first determining unit as the stability parameter of the first input signal at a current time, so that the value of the determinant may be a positive number that is not zero.

Optionally, in another embodiment, the second determining module includes a first determining unit configured to transpose the reference input matrix, to obtain a transposed matrix; a multiplication unit configured to multiply the transposed matrix obtained by the first determining unit by the reference input matrix, to obtain a second matrix; and a third determining unit configured to determine, as the stability parameter, a result obtained by taking a logarithm of a value of a determinant of the second matrix determined by the multiplication unit.

In this embodiment of the present application, the stability parameter $\alpha$ of the first input signal is determined in a logarithm domain, which can effectively reduce a value range of the stability parameter $\alpha$, making it easier to determine the value of the stability factor.

Alternatively, the first determining unit may be configured to determine a sum of a positive real number and a product of the transposed matrix of the reference input matrix and the reference input matrix as a second matrix; and the third determining unit is configured to determine, as the stability parameter of the first input signal, a result obtained by taking a logarithm of a value of a determinant of the second matrix determined by the first determining unit, so that the value of the determinant may be a positive number that is not zero.

Figure 7:
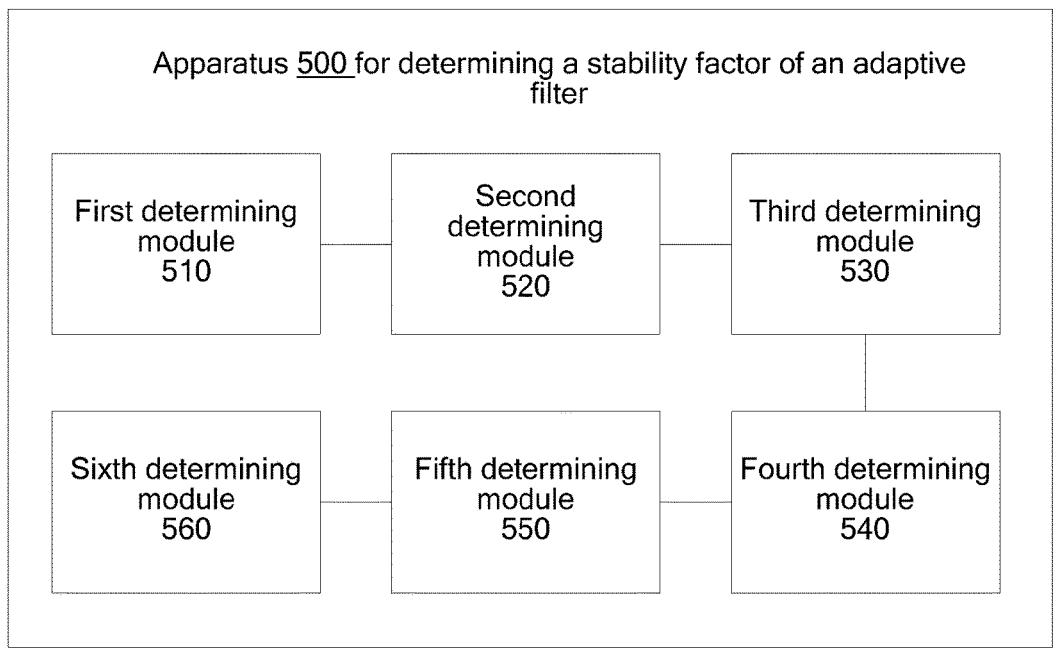
FIG. 7 is a structural block diagram of an apparatus for determining a stability factor of an adaptive filter according to another embodiment of the present application.

Optionally, in another embodiment, as shown in FIG. 7, the apparatus 500 further includes a fourth determining module 540, a fifth determining module 550, and a sixth determining module 560, where the fourth determining module 540 is configured to determine, according to second input signal that are input to the adaptive filter, an input vector of the second input signal; the fifth determining module 550 is configured to determine an output signal at a current time according to a coefficient of the adaptive filter at the current time, the input vector determined by the fourth determining module 540, and the reference input matrix determined by the first determining module 510; and the sixth determining module 560 is configured to determine a filtering coefficient of the adaptive filter according to the reference input matrix determined by the first determining module 510, the output signal determined by the fifth determining module 550, the stability factor determined by the third determining module 530, and an update step of the adaptive filter.

In should be understood that, in this embodiment of the present application, the apparatus 500 according to this embodiment of the present application may correspond to an entity for executing methods in the embodiments of the present application, and the foregoing and other operations and/or functions of modules in the apparatus 500 are separately used to implement corresponding procedures of the methods in FIG. 1 to FIG. 4. For brevity, details are not described herein again.

Therefore, according to the apparatus for determining a stability factor of an adaptive filter provided in this embodiment of the present application, a stability factor of an adaptive filter is determined according to a stability parameter of first input signal that is determined according to a reference input matrix of the first input signal of the adaptive filter, so that the stability factor of the adaptive filter can be adaptively obtained according to a stability feature of the first input signal, and the adaptive filter can reach a balance between a convergence speed and steady state error performance.

Figure 8:
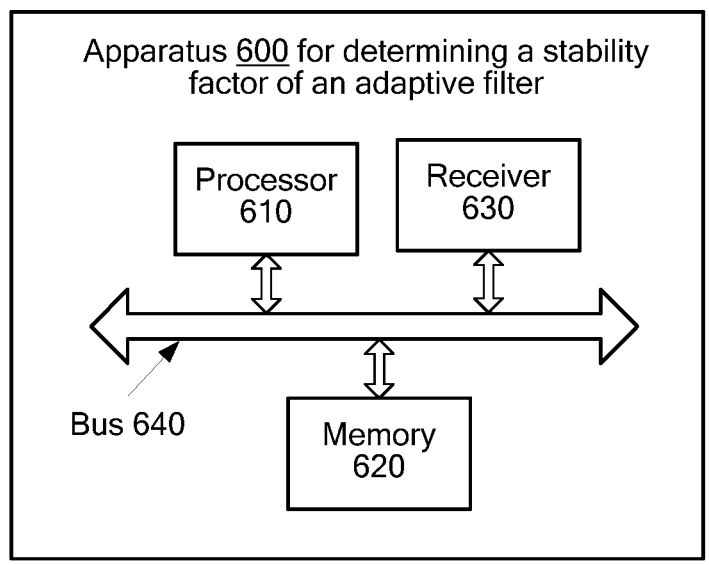
FIG. 8 is a schematic block diagram of an apparatus for determining a stability factor of an adaptive filter according to an embodiment of the present application.

FIG. 8 is a schematic block diagram of an apparatus 600 for determining a stability factor of an adaptive filter according to an embodiment of the present application. As shown in FIG. 8, the apparatus 600 includes a processor 610, a memory 620, a receiver 630, and a bus 640. The processor 610, the memory 620, and the receiver 630 are connected to each other using the bus system 640, the memory 620 is configured to store an instruction, and the processor 610 is configured to execute the instruction stored in the memory 620.

The receiver 630 is configured to receive first input signal.

The processor 610 is configured to determine, according to the first input signal that are input to an adaptive filter, a reference input matrix of the first input signal; determine a stability parameter of the first input signal according to the reference input matrix; and determine a stability factor of the adaptive filter according to the stability parameter.

Therefore, according to the apparatus for determining a stability factor of an adaptive filter provided in this embodiment of the present application, a stability factor of an adaptive filter is determined according to a stability parameter of first input signal that is determined according to a reference input matrix of the first input signal of the adaptive filter, so that the stability factor of the adaptive filter can be adaptively obtained according to a stability feature of the first input signal, and the adaptive filter can reach a balance between a convergence speed and steady state error performance.

It should be understood that in this embodiment of the present application, the processor 610 may be a central processing unit (CPU), or the processor 610 may be another general purpose processor, digital signal processor (DSP), application-specific integrated circuit (ASIC), or field-programmable gate array (FPGA), or another programmable logic device, discrete gate or transistor logic device, independent hardware component, or the like. The general purpose processor may be a microprocessor or the processor may be any conventional processor or the like.

The memory 620 may include a read-only memory (ROM) and a random-access memory (RAM), and provides an instruction and data to the processor 610. A part of the memory 620 may further include a non-volatile RAM. For example, the memory 620 may further store device type information.

The bus system 640 may include a power bus, a control bus, a status signal bus, and the like in addition to a data bus. However, for clear description, various types of buses in the figure are marked as the bus system 640.

In an implementation process, the steps of the method may be completed using an integrated logic circuit of hardware in the processor 610 or an instruction in a software form. Steps of the methods disclosed with reference to the embodiments of the present application may be directly performed and completed by means of a hardware processor, or may be performed and completed using a combination of hardware and software modules in the processor. The software module may be located in a mature storage medium in the field, such as a RAM, a flash memory, a ROM, a programmable ROM, an electrically-erasable programmable memory (EEPROM), or a register. The storage medium is located in the memory 620, and the processor 610 reads information in the memory 620 and completes the steps in the foregoing methods in combination with hardware of the processor. To avoid repetition, details are not described herein again.

Optionally, in an embodiment, the processor 610 is configured to determine the stability factor according to the stability parameter and a decreasing function relation between the stability factor and the stability parameter.

Optionally, in another embodiment, the processor 610 is configured to, when the stability parameter is greater than or equal to a first threshold and is less than or equal to a second threshold, determine the stability factor according to the following function relational expression:

$$k_\delta = A\alpha + B,$$

where $k_\delta$ is the stability factor, $\alpha$ is the stability parameter, A is a real number less than 0, and B is a real number greater than 0.

Optionally, in another embodiment, the processor 610 is configured to, when the stability parameter is less than or equal to a third threshold, determine that the stability factor is a first constant, or when the stability parameter is greater than or equal to a fourth threshold, determine that the stability factor is a second constant, where the third threshold is less than the fourth threshold, both the first constant and the second constant are numbers greater than 0, and the first constant is greater than the second constant.

Optionally, in another embodiment, the processor 610 is configured to transpose the reference input matrix, to obtain a transposed matrix; multiply the transposed matrix by the reference input matrix, to obtain a first matrix; and determine a value of a determinant of the first matrix as the stability parameter.

Optionally, in another embodiment, the processor 610 is configured to transpose the reference input matrix, to obtain a transposed matrix; multiply the transposed matrix by the reference input matrix, to obtain a second matrix; and determine, as the stability parameter, a result obtained by taking a logarithm of a value of a determinant of the second matrix.

Optionally, in another embodiment, the receiver 630 is configured to receive second input signal.

The processor 610 is further configured to determine, according to the second input signal that are input to the adaptive filter, an input vector of the second input signal; determine an output signal at a current time according to a coefficient of the adaptive filter at the current time, the input vector, and the reference input matrix; and determine a filtering coefficient of the adaptive filter according to the reference input matrix, the output signal, the stability factor, and an update step of the adaptive filter.

In should be understood that, in this embodiment of the present application, the apparatus 600 according to this embodiment of the present application may correspond to an entity for executing methods in the embodiments of the present application, and may correspond to the apparatus 500, and the foregoing and other operations and/or functions of modules in the apparatus 600 are separately used to implement corresponding procedures of the methods in FIG. 1 to FIG. 4. For brevity, details are not described herein again.

Therefore, according to the apparatus for determining a stability factor of an adaptive filter provided in this embodiment of the present application, a stability factor of an adaptive filter is determined according to a stability parameter of first input signal that is determined according to a reference input matrix of the first input signal of the adaptive filter, so that the stability factor of the adaptive filter can be adaptively obtained according to a stability feature of the first input signal, and the adaptive filter can reach a balance between a convergence speed and steady state error performance.

A person of ordinary skill in the art may be aware that, in combination with the examples described in the embodiments disclosed in this specification, method steps and units may be implemented by electronic hardware, computer software, or a combination thereof. To clearly describe the interchangeability between the hardware and the software, the foregoing has generally described steps and compositions of each embodiment according to functions. Whether the functions are performed by hardware or software depends on particular applications and design constraint conditions of the technical solutions. A person of ordinary skill in the art may use different methods to implement the described functions for each particular application, but it should not be considered that the implementation goes beyond the scope of the present application.

It may be clearly understood by a person skilled in the art that, for the purpose of convenient and brief description, for a detailed working process of the foregoing system, apparatus, and unit, reference may be made to a corresponding process in the foregoing method embodiments, and details are not described herein.

In the several embodiments provided in this application, it should be understood that the disclosed system, apparatus, and method may be implemented in other manners. For example, the described apparatus embodiment is merely exemplary. For example, the unit division is merely logical function division and may be other division in actual implementation. For example, a plurality of units or components may be combined or integrated into another system, or some features may be ignored or not performed. In addition, the displayed or discussed mutual couplings or direct couplings or communication connections may be implemented through some interfaces. The indirect couplings or communication connections between the apparatuses or units may be implemented in electronic, mechanical, or other forms.

The units described as separate parts may or may not be physically separate, and parts displayed as units may or may not be physical units, may be located in one position, or may be distributed on a plurality of network units. A part or all of the units may be selected according to actual needs to achieve the objectives of the solutions of the embodiments of the present application.

In addition, functional units in the embodiments of the present application may be integrated into one processing unit, or each of the units may exist alone physically, or two or more units are integrated into one unit. The integrated unit may be implemented in a form of hardware, or may be implemented in a form of a software functional unit.

Methods or steps described in the embodiments disclosed in this specification may be implemented by hardware, a software program executed by a processor, or a combination thereof. The software program may reside in a RAM, a memory, a ROM, an electrically programmable ROM (EPROM), an EEPROM, a register, a hard disk, a removable disk, a compact disc-ROM (CD-ROM), or any other form of storage medium known in the art.

The present application is described in detail with reference to the accompany drawings and in combination with the exemplary embodiments, but the present application is not limited thereto. Various equivalent modifications or replacements can be made to the embodiments of the present application by a person of ordinary skill in the art without departing from the spirit and essence of the present application, and the modifications or replacements shall fall within the scope of the present application.

What is claimed is:

1. A method for determining a stability factor of an adaptive filter, comprising:
   determining, by a processor according to a first input signal that is input to the adaptive filter, a reference input matrix of the first input signal;
   determining, by the processor, a stability parameter of the first input signal according to the reference input matrix by:
      transposing the reference input matrix in order to obtain a transposed matrix;
      multiplying the transposed matrix by the reference input matrix in order to obtain a first matrix; and
      determining, as the stability parameter, either a value of a determinant of the first matrix or a result obtained by taking a logarithm of a value of a determinant of the first matrix; and
   determining, by the processor, the stability factor of the adaptive filter according to the stability parameter.

2. The method according to claim 1, wherein determining the stability factor of the adaptive filter according to the stability parameter comprises determining the stability factor of the adaptive filter according to the stability parameter and a decreasing function relation between the stability factor and the stability parameter.

3. The method according to claim 2, wherein determining the stability factor of the adaptive filter according to the stability parameter and the decreasing function relation between the stability factor and the stability parameter comprises determining, when the stability parameter is greater than or equal to a first threshold and is less than or equal to a second threshold, the stability factor according to the following function relational expression:

$$k_\delta = A\alpha + B,$$

wherein $k_\delta$ is the stability factor, wherein $\alpha$ is the stability parameter, wherein A is a real number less than 0, and wherein B is a real number greater than 0.

4. The method according to claim 1, wherein determining the stability factor of the adaptive filter according to the stability parameter comprises:
   determining, by the processor, that the stability factor is a first constant when the stability parameter is less than or equal to a third threshold; or
   determining, by the processor, that the stability factor is a second constant when the stability parameter is greater than or equal to a fourth threshold, wherein the third threshold is less than the fourth threshold, wherein both the first constant and the second constant are numbers greater than 0, and wherein the first constant is greater than the second constant.

5. The method according to claim 1, further comprising:
   determining, according to second input signal that is input to the adaptive filter, an input vector of the second input signal;
   determining an output signal at a current time according to a coefficient of the adaptive filter at the current time, the input vector, and the reference input matrix; and
   determining a filtering coefficient of the adaptive filter according to the reference input matrix, the output signal, the stability factor, and an update step of the adaptive filter.

6. An apparatus for determining a stability factor of an adaptive filter, comprising:
   a memory storing executable instructions; and
   a processor coupled to the memory and configured to:
      determine, according to a first input signal that is input to the adaptive filter, a reference input matrix of the first input signal;
      determine a stability parameter of the first input signal according to the reference input matrix by:
         transposing the reference input matrix, to obtain a transposed matrix;
         multiplying the transposed matrix obtained by the reference input matrix, to obtain a first matrix; and
         determining, as the stability parameter, either a value of a determinant of the first matrix or a result obtained by taking a logarithm of a value of a determinant of the first matrix; and
      determine the stability factor of the adaptive filter according to the stability parameter.

7. The apparatus according to claim 6, wherein the processor is further configured to determine the stability factor of the adaptive filter according to the stability parameter and a decreasing function relation between the stability factor and the stability parameter.

8. The apparatus according to claim 7, wherein the processor is further configured to determine, when the stability parameter is greater than or equal to a first threshold and is less than or equal to a second threshold, the stability factor according to the following function relational expression:

$$k_\delta = A\alpha + B,$$

wherein $k_\delta$ is the stability factor, wherein $\alpha$ is the stability parameter, wherein A is a real number less than 0, and wherein B is a real number greater than 0.

9. The apparatus according to claim 6, wherein the processor is further configured to:
  determine that the stability factor is a first constant when the stability parameter is less than or equal to a third threshold; and
  determine that the stability factor is a second constant when the stability parameter is greater than or equal to a fourth threshold, wherein the third threshold is less than the fourth threshold, wherein both the first constant and the second constant are numbers greater than 0, and wherein the first constant is greater than the second constant.

10. The apparatus according to claim 6, wherein the processor is further configured to:
  determine, according to second input signal that is input to the adaptive filter, an input vector of the second input signal;
  determine an output signal at a current time according to a coefficient of the adaptive filter at the current time, the input vector, and the reference input matrix; and
  determine a filtering coefficient of the adaptive filter according to the reference input matrix, the output signal, the stability factor, and an update step of the adaptive filter.

* * * * *

UNITED STATES PATENT AND TRADEMARK OFFICE
CERTIFICATE OF CORRECTION

PATENT NO. : 9,973,174 B2  
APPLICATION NO. : 15/400147  
DATED : May 15, 2018  
INVENTOR(S) : Eyal Shlomot, Yuanyuan Liu and Haiting Li Page 1 of 1

It is certified that error appears in the above-identified patent and that said Letters Patent is hereby corrected as shown below:

On the Title Page

Under item Notice should read:
Subject to any disclaimer, the term of this patent is extended or adjusted under 35 U.S.C. 154(b) by 0 days.

Signed and Sealed this
Third Day of July, 2018

Andrei Iancu
*Director of the United States Patent and Trademark Office*